(12) United States Patent
Heller et al.

(10) Patent No.: US 7,612,576 B1
(45) Date of Patent: Nov. 3, 2009

(54) METHOD FOR DETECTING AN INVERTER HARDWARE FAILURE IN AN ELECTRIC POWER TRAIN

(75) Inventors: Marcus Heller, Farmington Hills, MI (US); Jody Nelson, West Bloomfield, MI (US)

(73) Assignee: Daimler AG, Stuttgart (DE)

( * ) Notice: Subject to any disclaimer, the term of this patent is extended or adjusted under 35 U.S.C. 154(b) by 0 days.

(21) Appl. No.: 12/229,071

(22) Filed: Aug. 19, 2008

(51) Int. Cl.
*G01R 31/34* (2006.01)
*G01R 31/00* (2006.01)

(52) U.S. Cl. ............... 324/772; 324/143; 318/490; 318/638

(58) Field of Classification Search .......... 324/772; 318/490, 638
See application file for complete search history.

(56) References Cited

U.S. PATENT DOCUMENTS

| | | | |
|---|---|---|---|
| 5,895,989 A | 4/1999 | Imaizumi | |
| 6,020,735 A | 2/2000 | Barnet | |
| 6,145,107 A | 11/2000 | Faeokhzad | |
| 6,967,454 B1 * | 11/2005 | Braun | 318/565 |
| 7,489,487 B2 * | 2/2009 | Oka | 361/79 |
| 2008/0265819 A1 * | 10/2008 | Chen et al. | 318/490 |

* cited by examiner

*Primary Examiner*—Ha Tran T Nguyen
*Assistant Examiner*—Emily Y Chan
(74) *Attorney, Agent, or Firm*—Klaus J. Bach

(57) ABSTRACT

In a method for detecting an inverter hardware failure in an electric power train comprising high voltage cables, at least one electric machine and at least two inverter legs with two power electronic switches respectively for pulse-width-modulating a DC voltage from a high voltage battery for energizing the at least one electric machine, and including at least one mid-pack voltage sensor for detecting isolation faults, wherein all power electronic switches are demanded to open; at least one of the power electronic switches of one of the inverter legs is opened and closed at a time at a given duty cycle and a given frequency; a mid-pack voltage is measured using the mid-pack voltage sensor; the closed switch is identified as functional in case a common mode voltage is detected by the mid-pack voltage sensor or otherwise the closed switch is identified as non-functional.

11 Claims, 2 Drawing Sheets

METHOD FOR DETECTING AN INVERTER HARDWARE FAILURE IN AN ELECTRIC POWER TRAIN

BACKGROUND OF THE INVENTION

1. Field of the Invention

The invention refers to a method for detecting an inverter hardware failure in an electric power train.

2. Description of the Background Art

Hybrid vehicles are equipped with high power electric machines which are energized by high voltage batteries. The DC voltage of the battery is pulse-width-modulated by a number of power electronic switches as parts of a power inverter arranged in legs each one supplying a terminal of the electric machine. Two of the switches are connected in series in each leg and the electric machine's terminal is connected in the middle to both of them. The pulse-width-modulated voltage is integrated by the electric machine's inductance resulting in a virtual sine wave AC voltage. As in most cases the electric machine is a three phase machine and three inverter legs are provided and controlled so as to generate a three phase AC voltage respectively.

The power train composed of the electric machine, the inverter switches and respective high voltage cables are connected to the high voltage battery via a link, the link comprising a bulk capacitance and a Y-capacitance, both connected to a positive terminal and to a negative terminal of the high voltage battery. The Y-capacitance has three terminals, two of them connected to the positive terminal and the negative terminal of the battery. The third one is a center tapping connected to a metallic housing or chassis of the vehicle which is electrically isolated from the battery. The bulk capacitance serves for reducing voltage ripple, while the Y-capacitance is required to meet EMC (electromagnetic compatibility) and HV (high voltage) isolation requirements. It serves for reducing or eliminating common-mode voltage at the terminals of the electric machine caused by the machine's stray capacitance. A voltage divider arranged between the battery terminals provides a virtual mid-pack battery potential. A mid-pack voltage sensor is arranged between the metallic housing and the virtual mid-pack battery potential. The mid-pack voltage sensor is used for detecting isolation faults between the housing or chassis and the battery.

When the vehicle equipped with the electric power train has been stalled due to conditions pointing to a failure in the electric components of the power train, there are three major sources of the fault: 1) the electric machine, 2) the high voltage cables, or 3) the power inverter, i.e. at least one of the electronic power switches. An visual check of the high voltage cable can easily determine or eliminate it as the source of the fault. However, determining between the electric machine and the power inverter is not trivial and can cause unnecessary expenses. If there is no instrumentation available, there are only a few subjective inspections available before a mechanic or a technician will first replace the power inverter and then the transmission until the vehicle is running properly again.

In order to make sure the power train operates reliably, the power electronic switches, e.g. IGBTs, have to be tested.

U.S. Pat. No. 6,020,735 discloses an internal diode detection circuit for a device under test and a method of operating a test fixture for employing the same. The internal diode detection circuit includes a source of electrical power that applies a reverse bias voltage to the device under test. The internal diode detection circuit also includes a current indicator, series-coupled to the device under test that generates a signal when a current flows through the device under test. The signal indicates a presence of an internal diode in the device under test.

U.S. Pat. No. 6,145,107 discloses a method for early failure recognition in power semiconductor modules which employs a measurement across a resistor between a bonded emitter terminal and a bonded auxiliary emitter terminal that identifies the degradation of the bond point which triggers an early warning signal so that the power semiconductor module can be changed before failure and the overall reliability of an electronic power system can thereby be increased.

U.S. Pat. No. 5,895,989 discloses a power supply unit adapted to supply power from a power supply section to a load via a plurality of power supply lines connected by an on/off switch and connectors. The power supply unit includes a load open detection section for detecting an open state between the on/off switch and the load, a monitor section for monitoring the number of times the open state has been entered per unit time based on the detection result of the load open detection section, and a control section for controlling the on/off switch off when the number of times the open state has been entered per unit time is greater than a predetermined number of times.

It is an object of the present invention to provide a method for detecting an inverter hardware failure in an electric power train.

SUMMARY OF THE INVENTION

In a method for detecting an inverter hardware failure in an electric power train comprising high voltage cables, at least one electric machine and at least two inverter legs with two power electronic switches respectively for pulse-width-modulating a DC voltage from a high voltage battery for energizing the at least one electric machine, and including at least one mid-pack voltage sensor for detecting isolation faults is arranged:

requiring all power electronic switches are demanded to open;

opening and closing at least one of the power electronic switches of one of the inverter legs is opened and closed at a time at a given duty cycle and a given frequency;

a mid-pack voltage is measured by using the mid-pack voltage sensor;

the closed switch is identified as functional in case a common mode voltage is detected by the mid-pack voltage sensor or otherwise the closed switch is identified as non-functional.

The method according to the invention is used for detecting an inverter hardware failure in an electric power train. The power train comprises high voltage cables, at least one electric machine and at least two inverter legs with two power electronic switches respectively for pulse-width-modulating a direct voltage from a high voltage battery, which may typically be 300 V in a hybrid vehicle. The pulse-width-modulated voltage is used for energizing the at least one electric machine. The power train is connected to the high voltage (HV) battery via a link, the link comprising a bulk capacitance and a Y-capacitance. Both, the bulk capacitance and the Y-capacitance are connected to a positive terminal and to a negative terminal of the high voltage battery. A center tapping of the Y-capacitance is additionally connected to a metallic housing electrically isolated from the battery. At least one mid-pack voltage sensor for detecting isolation faults is provided. An isolation fault is detected in case the mid-pack voltage sensor detects a mid-pack potential different from half the HV battery voltage in a voltage divider arranged between the battery terminals. The voltage divider comprises two equal resistances.

The mid-pack sensor may be arranged between the metallic housing and a virtual mid-pack battery potential provided by the voltage divider. It may as well be arranged between the virtual mid-pack battery potential and one of the battery terminals.

The method according to the invention comprises the steps of:
- demanding all power electronic switches to open;
- opening and closing one of the power electronic switches of one of the legs at a time at a given duty cycle and a given frequency;
- measuring a mid-pack voltage by using the mid-pack voltage sensor;
- identifying the closed switch as functional in case a common mode (CM) voltage is detected by the mid-pack voltage sensor or otherwise identifying the closed switch as non-functional.

The invention utilizes existing mid-pack voltage sensors, which are required for detecting isolation failures. When the switch begins switching, a common mode (CM) voltage is created due to the Y-capacitance and the distributed stray capacitance of the electric machine. The stray capacitance can be modelled as a capacitance between a neutral point of the electric machine and the housing or chassis. The stray capacitance is not an actual component but inherent to the electric machine. If the power electronic switch, e.g. an IGBT (insulated gate bipolar transistor) is either failed open or failed short, there will be no common mode voltage and the mid-pack potential will equal exactly half of the battery voltage relative to one of the battery terminals, provided there is no isolation fault.

The method requires no additional hardware. Instead it may be performed by a software function. The method can identify individual power electronic switch failures in a short time. Reliably identifying such failures can possibly save large expenses in service when applied to properly determine a source of failure in particular electrical power train failure conditions. The invention can also allow for an on-line determination of the operating status of an individual power electronic switch.

If one of the power electronic switches is failed short while the other power electronic switch of the same leg is switched, a power switch saturation fault will be detected by the active switch which may be forwarded to indicate the shorted switch. Power switch saturation detection is a feature usually performed by power electronic switches such as IGBTs.

In an alternative embodiment of the invention the two power electronic switches of one of the inverter legs at a time may be alternately closed at a given duty cycle, a given dead time and a given frequency instead of opening and closing one of the power electronic switches of one of the legs at a time at a given duty cycle and a given frequency. This embodiment yields a common mode voltage amplified by 2 compared to switching only one of the switches at a time.

The method may particularly be applied to power trains with three inverter legs for supplying the electric machine with a three phase pulse-width-modulated voltage.

The method may be applied to power trains in vehicles, particularly hybrid vehicles.

The method may be performed during a power-on sequence or during a power-off sequence or during service of the vehicle.

The present invention will become more readily apparent from the following detailed description of preferred embodiments of the invention on the basis of the accompanying drawings.

DETAILED DESCRIPTION

Figure 1:
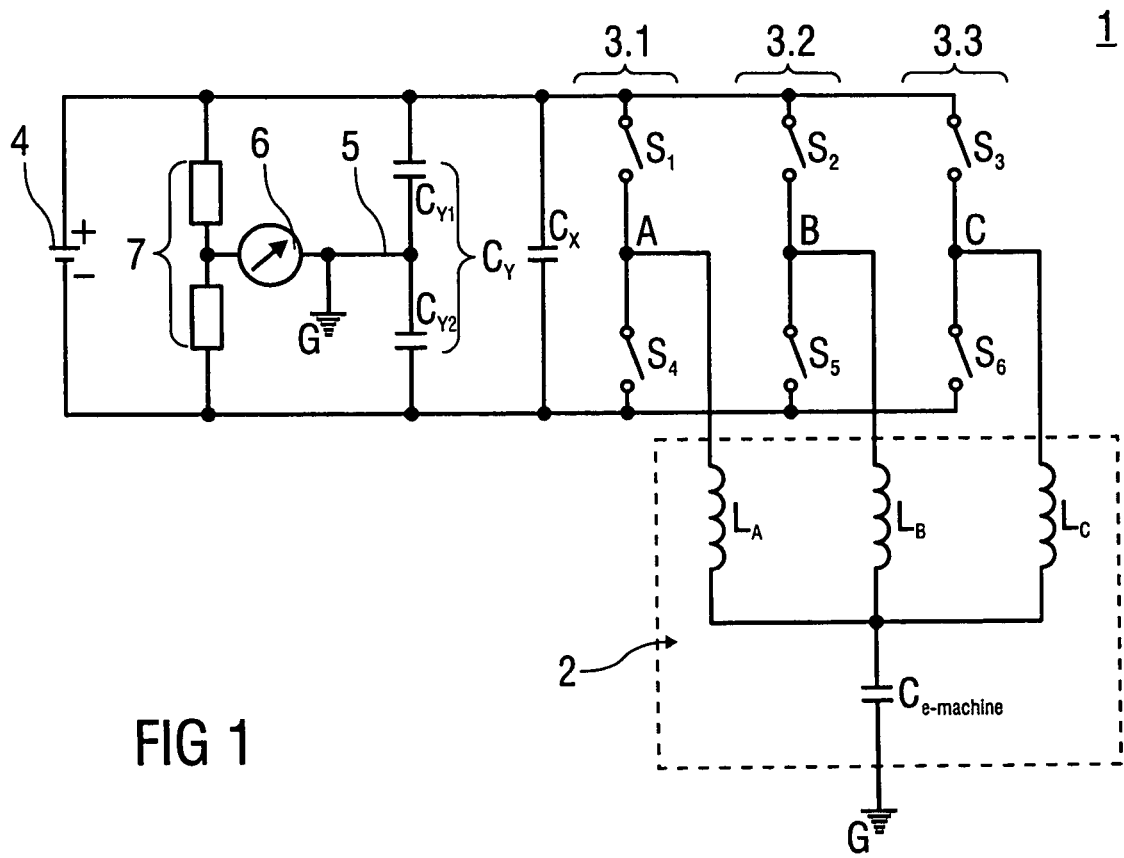
FIG. 1 shows a basic diagram of a power train.

FIG. 1 shows a basic diagram of a power train 1 for a vehicle, e.g. a hybrid vehicle. A three phase electric machine 2 is represented by three inductances $L_A$, $L_B$ and $L_C$ and a stray capacitance $c_{e\text{-}machine}$ between a neutral point of the electric machine 2 and a housing or chassis, i.e. ground G. The electric machine 2 is fed a pulse-width-modulated voltage by a power inverter comprising three inverter legs 3.1, 3.2, 3.3 each with two power electronic switches $S_1$ to $S_6$, the two power electronic switches $S_1$ to $S_6$ of each leg 3.1, 3.2, 3.3 respectively connected in series and the electric machine 2 connected to respective phases A, B, C between the two switches $S_1$ to $S_6$ of each leg 3.1, 3.2, 3.3. The power inverter is supplied with a DC voltage from a high voltage battery 4 having a positive terminal + and a negative terminal −. A bulk capacitance $C_X$ and a Y-Capacitance $C_Y$ are connected to the high voltage battery 4 as well. The Y-capacitance $C_Y$ actually consists of two capacitances $C_{Y1}$, $C_{Y2}$ connected in series. A center tapping 5 of the Y-capacitance is additionally grounded to the metallic housing or chassis G which in turn is electrically isolated from the battery 4. A mid-pack voltage sensor 6 for detecting isolation faults is arranged between the metallic housing G and a virtual mid-pack battery potential provided by a voltage divider 7. An isolation fault is detected in case the mid-pack voltage sensor 6 detects a mid-pack voltage different from zero.

In order to detect a failed power electronic switch $S_1$ to $S_6$ a method comprising the following steps may be applied:
- requiring all power electronic switches $S_1$ to $S_6$ open;
- opening and closing one of the power electronic switches $S_1$ to $S_6$ of one of the inverter legs 3.1, 3.2, 3.3 at a time at a given duty cycle and a given frequency;
- measuring the mid-pack voltage by using the mid-pack voltage sensor 6;
- identifying the closed switch $S_1$ to $S_6$ as functional in case a common mode voltage is detected by the mid-pack voltage sensor 6 or otherwise identifying the closed switch $S_1$ to $S_6$ as non-functional.

In case the closed switch $S_1$ to $S_6$ is non-functional the mid-pack potential will equal exactly half the voltage of the high voltage battery 4 relative to one of the battery terminals +, −. Provided the mid-pack sensor 6 is arranged as shown in FIG. 1 the mid-pack voltage detected will be zero in case of a non-functional switch $S_1$ to $S_6$.

The mid-pack voltage sensor 6 may be arranged in a different way, e.g. between the voltage divider 7 and one of the battery terminals +, −. There may be two mid-pack voltage sensors 6 respectively arranged between one of the battery terminals +, − and the voltage divider 7.

Figure 2:
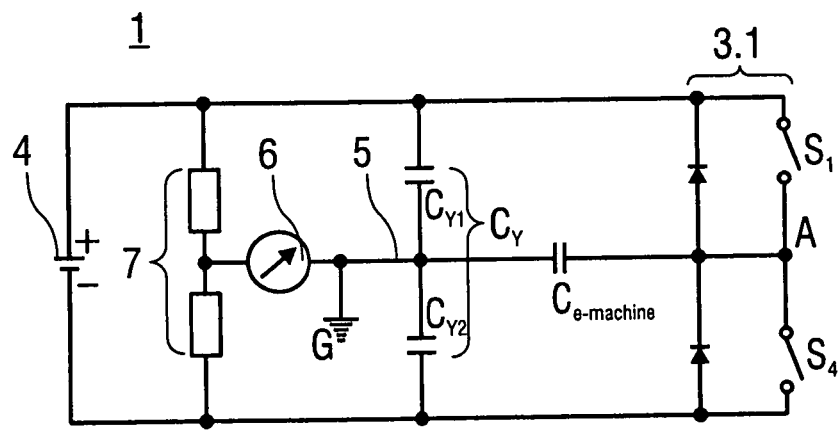
FIG. 2 shows a simplified circuit model of the power train.

The circuit shown in FIG. 1 can be simplified when only considering the common mode paths. FIG. 2 illustrates a simplified circuit model emphasizing the common mode paths to the chassis G. Considering the common mode paths the stray capacitance $c_{e\text{-}machine}$ is directly connected to the central tap 5 of the Y-capacitance $C_Y$. The diodes shown are part of the power electronic switches $S_1$, $S_4$ which are IGBTs. Only one of the legs 3.1 is shown here. The magnitude of the common mode voltage is defined by the capacitors $c_{e\text{-}machine}$, $C_Y$ along with the number of power electronic switches $S_1$, $S_4$ that are tested at a time and by the high voltage battery 2 voltage (also referred to as bus voltage).

Both experimental measurements using a production automotive power inverter and simulations were conducted to verify the method. For the measurements, a bench setup was created using a 30 V DC voltage as the battery voltage, the bench setup having no phase connections to the electric machine. To simulate the stray capacitance $c_{e\text{-}machine}$ a 22 nF capacitor was added from the phase A under investigation to the housing G of the power inverter. The method was performed during measurements with a 500 Hz switching frequency and 50% duty cycle.

Figure 3:
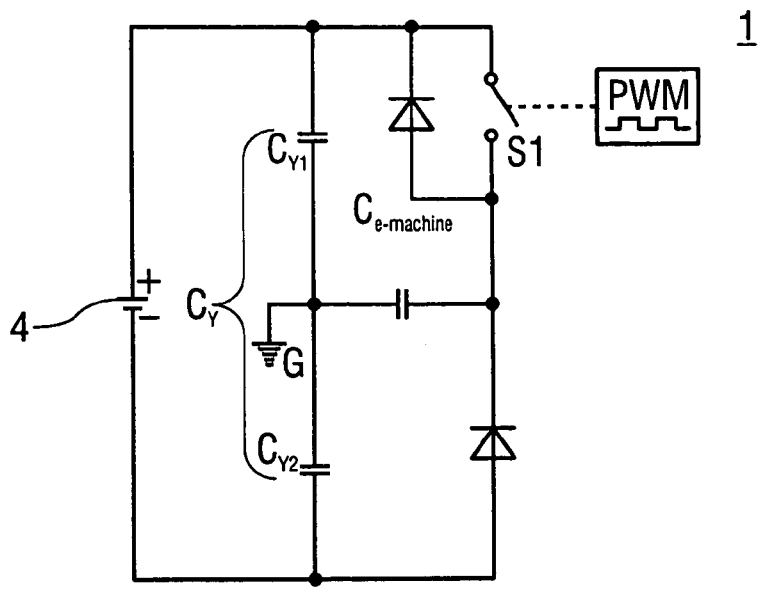
FIG. 3 shows a simulation model for verifying a method for detecting a hardware failure in the power train.

In parallel, a simulation model shown in FIG. 3 was created with the same parameters as the measurement. Since only the power electronic switch $S_1$ is tested the power electronic switch $S_4$ was replaced by a diode in reverse direction.

Figure 4:
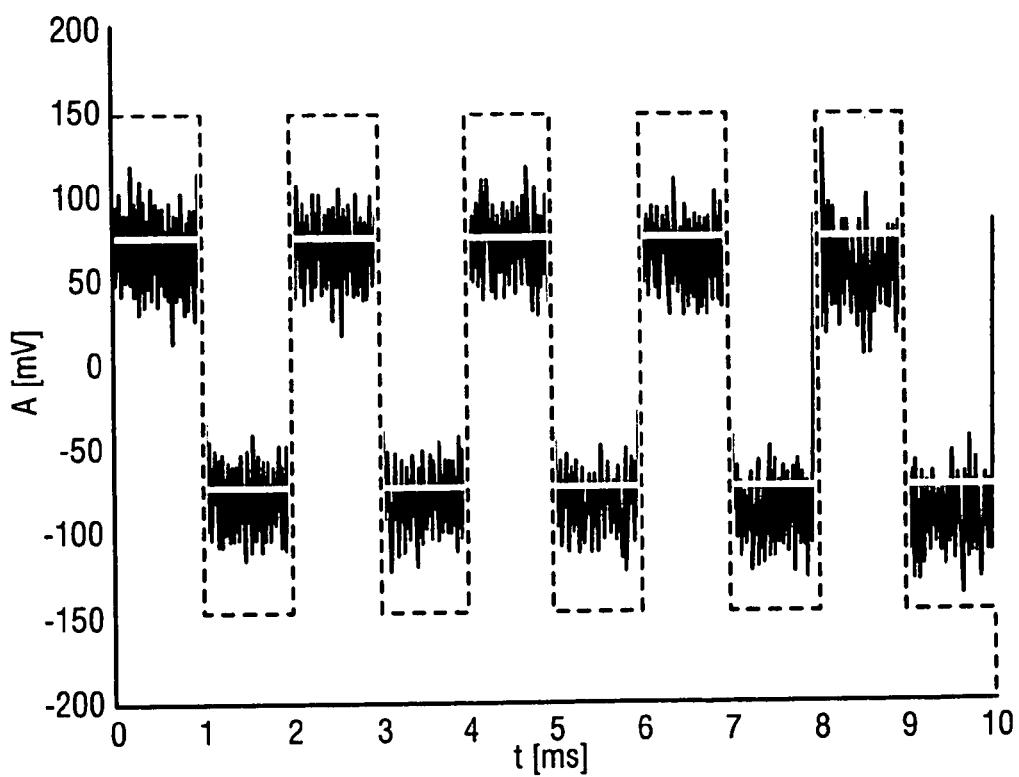
FIG. 4 is a chart showing simulation and measuring results when testing a power electronic switch of the power train.

Results of the measurements and simulation with AC-coupling only are illustrated in a diagram shown in FIG. 4. It is seen that the mid-pack voltages acquired by the method match well between the measurement (solid line) and simulation (white solid line).

An alternative embodiment of the method may be used, wherein the two power electronic switches $S_1$, $S_4$ of the leg 3.1 may be alternately closed at a given duty cycle, a given dead cycle and a given frequency instead of opening and closing one of the power electronic switches $S_1$, $S_4$ at a given duty cycle and a given frequency. This embodiment yields a common mode voltage amplified by 2 compared to switching only one of the switches $S_1$, $S_4$ at a time, which is indicated by the dashed line in FIG. 4. It is noted that the nominal hybrid electric vehicle (HEV) voltage may be 300 V. It is therefore expected that the magnitude of the common mode mid-pack voltage is increased by a factor of 10 from the simulations and measurements of FIG. 4. The peak-to-peak common mode voltage ripple for the method with two switches $S_1$, $S_4$ may be calculated by:

$$V_{PP} = \left(\frac{C_{e\text{-}machine}}{C_{e\text{-}machine} + C_Y}\right) \cdot \frac{V_{DC}}{2},$$

wherein $V_{DC}$ is the battery voltage.

The components shown are connected by respective high voltage cables.

There may be more than one electric machine 2.

The voltage of the high voltage battery 4 may typically be 300 V, particularly in a hybrid vehicle.

What is claimed is:

1. A method for detecting an inverter hardware failure in a power train having a positive and a negative terminal, a high voltage battery, high voltage cables, at least one electric machine and at least two inverter legs with two power electronic switches respectively for pulse-width-modulating a DC voltage from the high voltage battery for energizing the at least one electric machine, the power train being connected to the high voltage battery via a link comprising a bulk capacitance and a Y-capacitance, both being connected to the positive terminal and to the negative terminal of the high voltage battery, and a center tapping of the Y-capacitance additionally being connected to a metallic housing electrically isolated from the battery, and including at least one mid-pack voltage sensor for detecting isolation faults, said method comprising the steps of:

commanding all power electronic switches open;

closing and opening one of the power electronic switches of one of the legs at a certain time at a given duty cycle and a given frequency;

measuring a mid-pack voltage using the mid-pack voltage sensor;

identifying the switch as functional if, with the switch closed, a common mode voltage is detected by the mid-pack voltage sensor or, otherwise, identifying the closed switch as non-functional.

2. The method according to claim 1, wherein the power train is used in a vehicle and wherein the steps are performed during a power on sequence.

3. The method according to claim 1, wherein the power train is used in a vehicle and wherein the steps are performed during a power off sequence.

4. The method according to claim 1, wherein the power train is used in a vehicle and wherein the steps are performed during service of the electric machine.

5. The method according to claim 1, wherein the steps are performed by a software function.

6. The method according to claim 1, wherein the given duty cycle is 50% and the given frequency is 500 Hz.

7. The method according to claim 1, wherein the power electronic switches of a three-phase power train with three inverter legs are tested.

8. The method according to claim 1, wherein a power switch saturation fault is detected when one of the power electronic switches of one of the inverter legs is closed and the other one of the power electronic switches of that leg is failed short.

9. The method according to claim 1, wherein the mid-pack voltage sensor is arranged between the metallic housing and a virtual mid-pack battery potential provided by a voltage divider.

10. The method according to claim 1, wherein the mid-pack voltage sensor is arranged between one of the terminals of the battery and a virtual mid-pack battery potential provided by a voltage divider.

11. A method for detecting an inverter hardware failure in an electric power train comprising a high voltage battery having positive and negative terminals, high voltage cables, at least one electric machine and at least two inverter legs with two power electronic switches respectively for pulse-width-modulating a DC voltage from the high voltage battery for energizing the at least one electric machine, the power train being connected to the high voltage battery via a link comprising a bulk capacitance and a Y-capacitance, both being connected to the positive terminal and to the negative terminal of the high voltage battery and a center tapping of the Y-capacitance additionally being connected to a metallic housing electrically isolated from the battery, and including at least one mid-pack voltage sensor for detecting isolation faults, the method comprising the steps of:

requiring all power electronic switches open;

alternately closing and opening the two power electronic switches of one of the inverter legs at a certain time at a given duty cycle, a given dead time and a given frequency;

measuring a mid-pack voltage using the mid-pack voltage sensor;

identifying both switches of the leg as functional if, with the switches closed, a common mode voltage is detected by the mid-pack voltage sensor or, otherwise, identifying the leg as non-functional.

* * * * *